United States Patent [19]

Sankar et al.

[11] Patent Number: 4,839,497

[45] Date of Patent: Jun. 13, 1989

[54] DRILLING APPARATUS AND METHOD

[75] Inventors: Nott G. Sankar, Andover; Victor T. Pileeki, Townsend; George A. Zahaykevich, Watertown, all of Mass.

[73] Assignees: Digital Equipment Corporation, Maynard; Advanced Laser Systems, Inc., Waltham, both of Mass.

[21] Appl. No.: 92,558

[22] Filed: Sep. 3, 1987

[51] Int. Cl.⁴ .............................................. B23K 26/00
[52] U.S. Cl. .............................. 219/121.71; 219/121.76
[58] Field of Search ........... 219/121.7, 121.71, 121.75, 219/121.76, 121.67, 121.72

[56] References Cited

U.S. PATENT DOCUMENTS

| | | | |
|---|---|---|---|
| 3,453,097 | 7/1965 | Häfner | 219/121.72 X |
| 3,932,726 | 1/1976 | Verheyen et al. | 219/121.67 |
| 3,935,419 | 1/1976 | Lambert et al. | 219/121.67 |
| 4,167,662 | 9/1979 | Steen | 219/121.72 X |
| 4,323,757 | 4/1982 | Oka et al. | 219/121.67 X |
| 4,408,602 | 10/1983 | Nakajima | 219/121.76 X |
| 4,535,219 | 8/1985 | Sliwa, Jr. | 219/121.64 X |
| 4,661,679 | 4/1987 | Pardee | 219/121.6 |
| 4,707,584 | 11/1987 | Kimbara | 219/121.67 |

Primary Examiner—C. L. Albritton
Attorney, Agent, or Firm—Kenyon & Kenyon

[57] ABSTRACT

An apparatus and method for drilling holes in printed wiring boards formed of a plurality materials wherein two or more laser beams are combined along a common path and preferably focussed on the desired drilling site. The wavelengths of the lasers are selected such that they are each rapidly absorbed and therefor vaporized at least one of said materials. The laser beams are preferably focussed by a beam combining mirror. The lasers can be controlled to provide simultaneous or sequential emission of the laser beams.

19 Claims, 1 Drawing Sheet

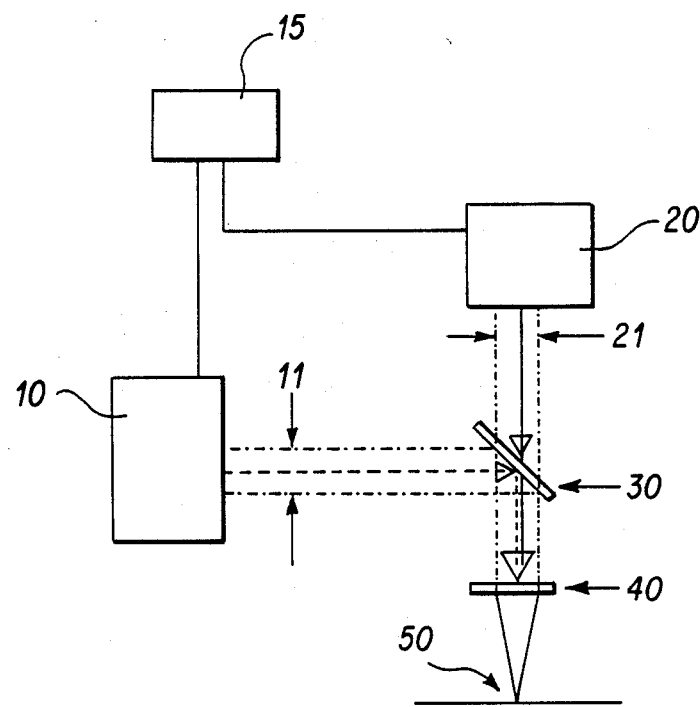

DRILLING APPARATUS AND METHOD

BACKGROUND OF THE INVENTION

The present invention relates to an apparatus and method for drilling composite materials, particularly printed wiring boards.

Printed wiring boards provide a means for mounting and connecting circuit components, e.g. integrated circuits, in electronic devices. Such a board may include an insulating substrate which is copper clad, with the copper cladding selectively etched to provide the desired circuit paths. The materials from which the substrates of printed wiring boards are formed are preferably of low heat capacities in order to avoid the conductance of heat and electricity which could adversely effect the proper functioning of the circuits connected thereto. Thus, printed wiring board (PWB) substrates are desirably formed of carefully selected materials, for example, glass reinforced polymers. In order to make proper electrical connections on the PWB, the PWB is formed as a laminate comprising layers of copper on the surface or surfaces of the substrate material. The copper surface or surfaces are then etched leaving a desired pattern of copper electrical connectors. Since the PWB serves as a mounting board for circuit components having protruding leads, it is usually necessary to drill holes in the PWB to receive the leads of the circuit components.

Known methods of drilling holes in printed wiring boards include using a mechanical drill utilizing N/C controlled drilling machines such as ADVANCED CONTROLS TRUDRILL MODEL 95 or an Excellon Model Mark IV. These types of drills use drill bits formed from tungsten carbide. In order to avoid drill bit breakage, maintain the consistency of the drilled hole, and avoid excessive damage to the portion of the PWB immediately adjacent to the drilled hole, the chip load (feed rate) has to be kept below about 0.5 mils/revolution and the number of hits per drill bit to about 500. It has been found that mechanical drilling can be expensive since tungsten carbide drill bits usually cost between $4.00 and $12.00 each, making the total drill bit cost alone about $60.00 for the mechanical drilling of very high density micromodules having 2500 holes. Furthermore, it has also been found that mechanical drilling is not suitable for drilling certain substrates, including quartz or kevlar reinforced polymers as well as homogeneous fused quartz substrates.

Another known approach, though not as widely practiced as mechanical drilling, is to use a single laser such as a neodimium YAG (Ytrium Aluminum Garnet) laser or carbon dioxide laser which are normally used in a pulsed mode. The single laser drilling method has been found to be satisfactory for PWBs having low laminate thicknesses of approximately 10 to 20 mils with no copper or low copper thicknesses, e.g. 0.0007 mils or lower. The single laser drilling approach, however, has a limited ability to penetrate through copper/polymer composites especially where the copper thickness exceeds 0.0007 mils. In order to drill through greater thicknesses, it has been found necessary to increase the power of the single laser. However, increasing the power adversely affects the area around the laser drilled holes possibly resulting in delamination. Thus, there is a need for an improved and less expensive manner of drilling holes in PWBs.

SUMMARY OF THE INVENTION

The present invention provides an improved method and apparatus for drilling holes in a substrate, e.g. a PWB, through the use of two or more lasers. As used herein, the term printed wiring board (PWB) comprises interconnect substrates formed from various materials such as epoxy glass, polyimides or ceramics.

In general, when a laser beam is incident on the surface of a substrate, the substrate absorbs and/or reflects the incident radiation. The degree of absorption will depend on the nature of the material forming the substrate and the wavelength of the incident beam. For efficient drilling, it is desirable that the substrate absorb substantially all of the incident radiation and thereby vaporize in the shortest possible time. Short, high energy pulses are preferable to longer pulses at lower energy levels since the short, high energy pulses advantageously rapidly vaporize the PWB while causing the least amount of damage to the area immediately surrounding the drilled hole. Therefore, it is most desirable to properly match the absorption characteristics of the material being drilled and the laser beam wavelength.

Different materials used in the PWB absorb electromagnetic radiation at any given wavelength to different degrees. For example, a polymer matrix will readily absorb a single carbon dioxide laser having a wavelength of 10.6 $\mu$m whereas the copper on the surface of the polymer substantially reflects radiation at this wavelength. Thus, a carbon dioxide laser is capable of efficiently vaporizing and removing polymer and glass material, but only slightly heats the copper layer. On the other hand a solid state laser such as a ruby laser having a shorter wavelength, such as 0.69 $\mu$m, is more readily absorbed by copper and is more suitable for drilling through copper.

In light of the characteristic properties of the composite or laminar materials to be drilled, particularly the fact that the different materials contained therein absorb incident radiation at different rates depending on the wavelength of the radiation, in accordance with the present invention, radiation having at least two different wavelengths is supplied to the drilling location. The present invention, therefore, provides an apparatus and method for perforating a composite or laminar material comprising means for generating a first electromagnetic wave along a first wave path and means for generating a second electromagnetic wave along a second wave path, wherein the second electromagnetic wave has a wavelength which is different from the wavelength of the first electromagnetic wave. The wavelengths are selected to maximize vaporization of the components of the material. The apparatus further preferably provides for directing the first electromagnetic wave and the second electromagnetic wave along a common wave path and then focussing the directed waves onto the material being drilled.

For drilling PWBs, it has been found desirable to utilize two lasers, such as a ruby laser and a carbon dioxide laser. The present invention is advantageous since the directing of two or more electromagnetic waves having different wavelengths permits several modes of operation without having to move the composite material between two independent laser systems while providing an efficient apparatus for drilling holes in multilayered or composite substrates. By drilling substrates on one tooling system, registration errors resulting from moving a part from one laser systems to another and back again, etc. are effectively eliminated. Furthermore, the maintenance costs for the drilling system of the present invention are lower than those for a mechanical drilling apparatus.

BRIEF DESCRIPTION OF THE DRAWING

The single FIGURE is a schematic illustration of one embodiment of the present invention.

DETAILED DESCRIPTION

The present invention provides an apparatus and method for perforating a composite or multilayered material, such as a printed wiring board, utilizing at least two electromagnetic waves having different wavelengths which are each readily absorbed by at least one of the materials which make up the composite or multilayered material, wherein the two beams are directed along a common axis and caused to impinge upon the material being drilled. Preferably, the combined beams are transmitted through a focusing mechanism such as a focusing lens, before reaching the composite material.

The electromagnetic waves of the present invention are preferably generated by lasers such as ruby, eximer, carbon dioxide or neodimium YAG lasers. It will be appreciated by those skilled in the art that different types of lasers may be desirable depending upon the materials being drilled. In general, ruby and eximer lasers have wavelengths appropriate for drilling through metallic materials while lasers such as carbon dioxide or neodimium YAG lasers are more preferable for drilling through polymeric materials. The apparatus of the present invention provides a means for drilling small holes, e.g. 1 to 8 mils in diameter, in composite materials. Specifically, the present invention provides an apparatus for efficiently drilling small holes, e.g. 1 to 6 mils in diameter, in composite or multilayered materials such as copper clad, glass reinforced epoxy or copper clad, glass reinforced polyimide. It will be appreciated that while the present process is particularly advantageous for drilling small holes, the apparatus and process is advantageously applicable for drilling large holes as well.

With reference to the FIGURE, a first source of electromagnetic radiation 10, such as a ruby laser, emits a first electromagnetic beam along a first axis 11 and a second source of electromagnetic radiation 20, such as a carbon dioxide laser, emits a second electromagnetic beam along a second axis 21.

The multiple electromagnetic wave beams 11 and 21 of the present invention are then directed, preferably by a beam combining mirror 30 as shown in the FIGURE, along a common wave path. The beam combining mirror 30 is preferably coated with a reflective coating on one surface to reflect the first electromagnetic wave 11 and to transmit the second electromagnetic wave 21 when these waves are incident on the mirror at an angle of about 45 degrees. The beam combining mirror 30 is positioned relative to each beam path to effect a multiple, e.g. dual, beam propagation along a common axis. As illustrated, beams 11 and 21 are preferably perpendicular and the mirror 30 is positioned at a 45° angle to the beams.

As stated above, the combined beam is then preferably focused onto the drilling site 50 by a focusing mechanism 40 such as a focusing lens. When using a ruby laser and a carbon dioxide laser, a zinc-selinide (ZnSe) lens has been found to be suitable. It will be appreciated that the focal length of the focusing lens should be selected to provide the desired hole diameter for the system used. Generally, lenses having focal lengths ranging from $1\frac{1}{2}''-5''$ have been found to be suitable. It will also be appreciated that the material of which the lens is formed should be transparent to the lasers being used.

When drilling through multilayered or composite materials, the electromagnetic wave beams can be preferably modulated on/off sequentially, in any combination, or simultaneously using a conventional control 15. If the wave beams are supplied by ruby and $CO_2$ lasers in pulsed modes, it has been found desirable to provide 1-4 pulses/second from the ruby laser and 100-1000 pulses/second from the $CO_2$ laser. The pulses are preferably evenly spaced and are supplied so that the duration of the pulse is equal to the duration of the period between pulses. Additionally, the control of the electromagnetic wave beams can be preferably coordinated with the movement of the material being drilled in order to rapidly drill multiple holes. The PWBs can be positioned by conventional means such as a standard X-Y table.

It will be appreciated that in accordance with the present invention, if two lasers such as a ruby laser and a carbon dioxide laser are directed along the same beam path and are simultaneous or sequentially incident on a copper clad glass reinforced polymer, each material in the composite is efficiently removed. The ruby laser is more effective initially on copper and will aid removal of copper while the carbon dioxide laser is mostly reflected. Once the combined laser beam penetrates through the copper and the polymer and glass matrix is exposed, the carbon dioxide beam becomes effective and efficiently removes the glass reinforced polymer.

EXAMPLE

An apparatus of the present invention was assembled using a ruby laser Model 604 obtained from Advanced Laser Systems of Waltham, Mass., as the source of the first electromagnetic wave beam. The ruby laser emitted a wave beam having a wavelength of about 0.69 $\mu$m which is readily absorbed by copper. The ruby laser was set to provide 2 pulses with a pulse length of about 300 microseconds and the energy setting was 1500 volts which provides a typical output of 1-3 Joules. The source of the second electromagnetic wave beam was a carbon dioxide laser, obtained from Coherent General of Sturbridge, Mass. (Model M46), which emitted radiation having a wavelength of about 10.6 $\mu$m and which is suitably absorbed by the polymer matrix. The $CO_2$ laser was set at a frequency of 500 Hz and programmed to emit radiation for 250 milliseconds resulting in the emission of 125 pulses. The $CO_2$ laser beam used had a peak power of about 700 Watts and a pulse length of about 100 microseconds. The ruby laser beam and carbon dioxide laser beam were combined by a beam combining mirror, made of Zinc-Selinide and was coated to perform in a manner similar to that shown in the FIGURE. The beam combining mirror was provided by Janos Technology, Inc., HRC 33 Box 25, Route 35, Townshend, Vt. 05353 (Model EK-101) having the following specifications:

Diameter: 2 inches;
Flat to $\frac{1}{4}$ wave at 10.6 microns;
Surface Quality: 40/20;
Parrallelism: 30 arc seconds at the center of thickness;
Surface 1: to give maximum reflectivity (at least 90%) at 0.69 microns at 45° angle of incidence;

Surface 2: to give maximum ante reflective (at least 80%) at 10.6 microns at 45° angle of incidence.

The combined beam was then focused by a final focusing lens formed of Zinc-Selenide (ZnSe) and having a focal length of 2½ inches. In this manner, the first pulse from the ruby laser vaporized a hole in the top copper cladding, the dielectric was then vaporized by the $CO_2$ laser, and the second ruby pulse then vaporized the bottom layer of copper cladding. The apparatus drilled holes with diameters of 5 mils at a rate of 50–60 holes per minute through a double sided PWB having about 1.4 mils of copper cladding on both sides and a dielectric thickness of about 8 mils.

As stated above, various types of laser radiation are advantageously utilized in the practice of the present invention. For example, a ruby laser having a wavelength of 0.69 $\mu$m and eximer lasers which have wavelengths ranging from 0.193–3.351 microns are suitable for drilling through a metal, e.g. copper, layer. A carbon dioxide laser having a wavelength of 10.6 $\mu$m is suitable for drilling through polymer materials. It is also possible to use YAG lasers. Selection of the proper electromagnetic radiation source along with properly controlling the duration of the incident wave beam results in an efficiently drilled hole without adversely effecting the area immediately adjacent to the drilling location.

The present invention is particularly suited for drilling perforated composite materials such as glass reinforced polymer materials, e.g. FR4, used in the manufacture of printed wiring boards. More particularly, the present invention is particularly suited for perforating copper clad, multilayered composite materials such as glass reinforced epoxy or copper clad, glass reinforced polyimide. The present invention is also suitable for drilling quartz or Kevlar TM (DuPont Corp.) reinforced polymers as well as homogeneous fused quartz substrates.

It will be appreciated that more than two sources of electromagnetic waves can be advantageously utilized within the scope of the present invention.

What is claimed is:

1. A method of drilling holes in a printed wiring board which comprises a first material and a second material comprising:
  generating a first laser beam;
  generating a second laser beam having a wavelength different from the wavelength of said first laser beam wherein said first laser beam and said second laser beam are selected to maximize vaporization of said first and second materials respectively; and
  directing said first laser beam and said second laser beam along a common beam path.

2. A method of drilling holes in a printed wiring board as in claim 1 further comprising the step of: focussing said directed beams on said printed wiring board.

3. A method of drilling holes in a printed wiring board as in claim 1 wherein said directed beams are focussed by a lens.

4. A method of drilling holes in a printed wiring board as in claim 3 wherein said lens is a zinc-selenium lens.

5. A method of drilling holes in a printed wiring board as in claim 1 wherein said laser beams are directed by a beam combining mirror.

6. A method of drilling holes in a printed wiring board as in claim 1 wherein said printed wiring board is a copper clad, glass reinforced polymer.

7. A method of drilling holes in a printed wiring board as in claim 1 wherein said printed wiring board is a kevlar reinforced polymer.

8. A method of drilling holes in a printed wiring board as in claim 1 further comprising the step of controlling the generation of said first laser beam and said second laser beam.

9. A method of drilling holes in a printed wiring board as in claim 8 wherein said laser beams are generated simultaneously.

10. A method of drilling holes in a printed wiring board as in claim 8 wherein said laser beams are generated sequentially.

11. A method of drilling holes in a printed wiring board as in claim 1 wherein said first laser beam is generated by a ruby laser.

12. A method of drilling holes in a printed wiring board as in claim 1 wherein said first laser beam is generated by an eximer laser.

13. A method of drilling holes in a printer wiring board as in claim 1 wherein said second laser beam is generated by a $CO_2$ laser.

14. A method of drilling holes in a printed wiring board as in claim 1 wherein said second laser beam is generated by a YAG laser.

15. A method of drilling holes in a printed wiring board as in claim 1 wherein said first laser beam is generated by a ruby laser and said second laser beam is generated by a $CO_2$ laser.

16. A method of drilling holes in a printed wiring board as in claim 15 wherein said laser beams are directed by a beam combining mirror.

17. A method of drilling holes in a printed wiring board as in claim 16 wherein said beam combining mirror substantially reflects said ruby laser beam and substantially transmits said $CO_2$ laser beam.

18. A method of drilling holes in a printed wiring board as in claim 1 wherein said printed wiring board is a glass reinforced epoxy clad with copper.

19. A method of drilling holes in a printed wiring board as in claim 1 wherein said printed wiring board is a glass reinforced polyimide clad with copper.

* * * * *